United States Patent [19]

Wood et al.

[11] Patent Number: 5,408,190
[45] Date of Patent: Apr. 18, 1995

[54] TESTING APPARATUS HAVING SUBSTRATE INTERCONNECT FOR DISCRETE DIE BURN-IN FOR NONPACKAGED DIE

[75] Inventors: Alan G. Wood, Boise; Warren M. Farnworth, Nampa; David R. Hembree, Boise, all of Id.

[73] Assignee: Micron Technology, Inc., Boise, Id.

[21] Appl. No.: 73,005

[22] Filed: Jun. 7, 1993

Related U.S. Application Data

[63] Continuation-in-part of Ser. No. 709,858, Jun. 4, 1991, abandoned, and a continuation-in-part of Ser. No. 788,065, Nov. 5, 1991, and a continuation-in-part of Ser. No. 981,956, Nov. 24, 1992.

[51] Int. Cl.6 .......................................... G01R 31/02
[52] U.S. Cl. ..................................... 324/765; 324/755
[58] Field of Search ............... 324/158 F, 158 P, 72.5, 324/158.1, 750, 754, 731, 765, 755; 361/411; 439/61, 91; 437/8; 257/40, 48; 174/52.4

[56] References Cited

U.S. PATENT DOCUMENTS

| | | | |
|---|---|---|---|
| 4,069,453 | 1/1978 | Veenendaal | 324/158 F |
| 4,288,841 | 9/1981 | Gogal | 361/414 |
| 4,324,040 | 4/1982 | Gottlieb | 29/829 |
| 4,340,860 | 7/1982 | Teeple, Jr. | 324/158 F |
| 4,437,718 | 3/1984 | Selinko | 339/61 M |
| 4,554,505 | 11/1985 | Zachry | 324/158 F |
| 4,560,216 | 12/1985 | Egawa | 339/12 V |
| 4,583,425 | 7/1987 | Tossutto et al. | 324/158 F |
| 4,597,617 | 7/1986 | Enochs | 339/17 CF |
| 4,675,599 | 6/1987 | Jensen et al. | 324/158 F |
| 4,683,423 | 7/1987 | Morton | 324/158 F |
| 4,686,468 | 8/1987 | Lee et al. | 324/158 F |
| 4,725,918 | 2/1988 | Bakker | 361/220 |
| 4,739,257 | 4/1988 | Jenson et al. | 324/158 F |
| 4,760,335 | 7/1988 | Lindberg | 324/158 F |
| 4,766,371 | 8/1988 | Moriya | 324/158 F |
| 4,843,313 | 6/1989 | Walton | 324/158 F |
| 4,855,672 | 9/1989 | Shreeve | 324/158 R |
| 4,899,107 | 2/1990 | Corbett et al. | 324/158 F |
| 4,954,878 | 9/1990 | Fox et al. | 357/81 |
| 4,956,605 | 9/1990 | Bickford et al. | 324/158 F |
| 4,970,460 | 11/1990 | Jensen et al. | 324/158 F |
| 4,987,365 | 1/1991 | Shreeve et al. | 324/158 F |
| 4,996,476 | 2/1991 | Balyasny et al. | 324/158 F |
| 5,073,117 | 12/1991 | Malhi | 439/71 |
| 5,109,320 | 4/1992 | Bourdelaise et al. | 361/413 |
| 5,123,850 | 6/1992 | Elder et al. | 439/67 |
| 5,140,405 | 8/1992 | King et al. | 357/67 |
| 5,177,439 | 1/1993 | Lui et al. | 324/158 P |
| 5,302,891 | 4/1994 | Wood et al. | 324/158 F |

OTHER PUBLICATIONS

"Ultra High Density Anisotropic Conductive Film", by M. Sugimoto et al., in *Technical Reports*.

*Primary Examiner*—Vinh Nguyen
*Attorney, Agent, or Firm*—Stanley N. Protigal; Stephen A. Gratton

[57] ABSTRACT

A reusable burn-in/test fixture for discrete die consists of two halves. The first half of the test fixture contains cavity in which die is inserted. Electrical contact with bondpads or bumps on the die is established through an intermediate substrate. When the two halves are assembled, electrical contact with the die is established. The fixture establishes the electrical contact and with a burn-in oven and with a discrete die tester. The test fixture need not be opened until the burn-in and electrical tests are completed. The fixture permits the die to be characterized prior to assembly, so that the die may then be transferred in an unpackaged form. The intermediate substrate may be formed of semiconductor material or of a ceramic insulator. A Z-axis anisotropic conductive interconnect material may be interposed between the intermediate substrate and the die.

33 Claims, 9 Drawing Sheets

TESTING APPARATUS HAVING SUBSTRATE INTERCONNECT FOR DISCRETE DIE BURN-IN FOR NONPACKAGED DIE

CROSS-REFERENCE TO RELATED APPLICATION

This is a continuation-in-part to U.S. patent application Ser. No. 7/709,858, filed Jun. 4, 1991, (abandoned), U.S. patent application Ser. No. 7/788,065, filed Nov. 5, 1991, and U.S. patent application Ser. No. 7/981,956, filed Nov. 24, 1992.

BACKGROUND OF THE INVENTION

1. Field of the Invention

This invention relates to electrical test equipment for semiconductor devices. More specifically, the invention relates to an apparatus and method, which utilize conductive polymers, and which are used to perform dynamic burn-in and full electrical/performance/speed testing on discrete nonpackaged or semi-packaged dies.

2. Background of the Invention

Semiconductor devices are subjected to a series of test procedures in order to assure quality and reliability. This testing procedure conventionally includes "probe testing", in which individual dies, while still on a wafer, are initially tested to determine functionality and speed. Probe cards are used to electrically test die at that level. The electrical connection interfaces with only a single die at a time in wafer; not discrete die.

If the wafer has a yield of functional dies which indicates that quality of the functional dies is likely to be good, each individual die is assembled in a package to form a semiconductor device. Conventionally, the packaging includes a lead frame and a plastic or ceramic housing.

The packaged devices are then subjected to another series of tests, which include burn-in and discrete testing. Discrete testing permits the devices to be tested for speed and for errors which may occur after assembly and after burn-in. Burn-in accelerates failure mechanisms by electrically exercising the devices (DUT) at elevated temperatures, thus eliminating potential failures which would not otherwise be apparent at nominal test conditions.

Variations on these procedures permit devices assembled onto circuit arrangements, such as memory boards, to be burned-in, along with the memory board in order to assure reliability of the circuit, as populated with devices. This closed assembly testing assumes that the devices are discretely packaged in order that it can then be performed more readily.

If the wafer has a yield of grossly functional die, it indicates that a good quantity of die from the wafer are likely to be fully operative. The die are separated with a die saw, and the nonfunctional die are scrapped, while the rest are individually encapsulated in plastic packages or mounted in ceramic packages with one die in each package. After the die are packaged they are rigorously electrically tested. Components which turn out to be nonfunctional, or which operate at questionable specifications, are scrapped or devoted to special uses.

Packaging unusable die, only to scrap them after testing, is a waste of time and materials, and is therefore costly. Given the relatively low profit margins of commodity semiconductor components such as dynamic random access memories (DRAMs) and static random access memories (SRAMs), this practice is uneconomical. However, no thorough and cost effective method of testing an unpackaged die is available which would prevent this unnecessary packaging of nonfunctional and marginally functional die. Secondly, the packaging may have other limitations which are aggravated by burn-in stress conditions, so that the packaging becomes a limitation for burn-in testing.

It is proposed that multiple integrated circuit devices be packaged as a single unit, known as a multi chip module (MCM). This can be accomplished with or without conventional lead frames. This creates two problems when using conventional test methods. Firstly, discrete testing is more difficult because a conventional lead frame package is not used. Furthermore, when multiple devices are assembled into a single package, the performance of the package is reduced to that of the die with the lowest performance. Therefore, such dies are tested on an individual basis at probe, using ambient and "hot chuck" test techniques, while still in wafer form. In other words, the ability to presort the individual dice is limited to that obtained through probe testing.

In addition, there is an increased interest in providing parts which are fully characterized prior to packaging. This is desired not only because of the cost of the package, but also because there is demand for multi-chip modules (MCMs), in which multiple parts in die form are tested and assembled into a single unit. While there are various techniques proposed for testing, burning in and characterizing a singulated die, it would be advantageous to be able to "wafer map" the die prior to assembly with as many performance characteristics as possible. Ideally, one would want to be able to map the wafer with full device characterization.

MCMs create a particular need for testing prior to assembly, as contrasted to the economics of testing parts which are discretely packaged as singulated parts. For discretely packaged parts, if the product yield of good parts from preliminary testing to final shipment (probe-to-ship) is, for example, 95%, one would not be particularly concerned with packaging costs for the failed parts, if packaging costs are 10% of the product manufacturing costs. Even where packaging costs are considerably higher, as in ceramic encapsulated parts, testing unpackaged die is economical for discretely packaged parts when the added costs approximates that of cost of packaging divided by yield:

$$C_{DIE} \times \frac{C_{PACKAGE}}{Yield} = C_{DIE} \times C_{ADDL.KGD}$$

where

C=cost $C_{DIE}$=manufacturing cost of functional die $C_{ADDL.KGD}$=additional cost of testing unpackaged die in order to produce known good die (KGD)

Note that in the case of discretely packaged parts, the cost of the die ($C_{DIE}$) is essentially not a factor. This changes in the case of MCMs:

$$(C_{DIE}) \times \frac{(\text{number of die})}{Yield} \times C_{PACKAGE} = C_{DIE} \times C_{ADDL.KGD}$$

Note that again $C_{DIE}$ is not a factor in modules having identical part types; however, the equation must be modified to account for varied costs and yields of die in modules with mixed part types.

With MCMs, the cost of packaging a failed part is proportional to the number of die in the module. In the case of a ×16 memory array module, where probe-to-ship yield of the die is 95%, the costs are:

$$\frac{16}{0.95} \times C_{PACKAGE} = C_{ADDL.KGD}$$

so the additional costs of testing for known good die (KGD) may be 16 times the cost of testing an unrepairable module and still be economical. This, of course, is modified by the ability to repair failed modules.

Testing of unpackaged die before packaging into multichip modules would be desirable as it would result in reduced material waste, increased profits, and increased throughput. Using only known good die in MCMs would increase MCM yields significantly.

Testing unpackaged die requires a significant amount of handling. Since the test package must be separated from the die, the temporary packaging may be more complicated than either standard discrete packaging or multichip module (MCM) packaging. The package must be compatible with test and burn-in procedures, while securing the die without damaging the die at the bondpads or elsewhere during the process.

In U.S. Pat. No. 4,899,107, commonly assigned, a reusable burn-in/test fixture for discrete TAB die is taught. The fixture consists of two halves, one of which is a die cavity plate for receiving semiconductor dies as the units under test (UUT); and the other half establishes electrical contact with the dies and with a burn-in oven.

The first half of the test fixture contains cavities in which die are inserted circuit side up. The die will rest on a floating platform. The second half has a rigid high temperature rated substrate, on which are mounted probes for each corresponding die pad. Each of a plurality of probes is connected to an electrical trace on the substrate (similar to a P.C. board) so that each die pad of each die is electrically isolated from one another for high speed functional testing purposes. The probe tips are arranged in an array to accommodate eight or sixteen dies.

The two halves of the test fixture are joined so that each pad on each die aligns with a corresponding probe tip. The test fixture is configured to house groups of 8 or 16 die for maximum efficiency of the functional testers.

There are some testing and related procedures when the parts are singulated. For this reason, it is inconvenient to retain multiple die in a single test fixture.

Various forms of connections are used to connect the die to a package or, in the case of a multichip module (MCM), to other connections. These include wirebonding, TAB connections, bump bonding directly to substrate, and conductive adhesives.

The bondpads are conductive areas on the face of the die which are used as an interconnect for connecting the circuitry on the die to the outside world. Normally, conductors are bonded to the bondpads, but it is possible to establish electrical contact through the bondpads by biasing conductors against the bondpads without actual bonding.

One of the problems encountered with burn in and full characterization testing of unpackaged die is the physical stress caused by connection of the bondpads to an external connection circuitry. This problem is complicated by the fact that in many die configurations, the bondpads are recessed below the surface level of a passivation layer. The passivation layer is a layer of low eutectic glass, such as BPSG, which is applied to the die in order to protect circuitry on the die. (The term "eutectic" does not, strictly speaking, apply to glass, which is an amorphous fluid; however, the term is used to describe the characteristic of some glasses wherein, as a result of their formulation, they readily flow at a given temperature.)

The ohmic contact between bondpads or test points on a die and a known good die test carrier package has been a matter of interest. It is difficult to achieve and maintain consistent ohmic contact without damaging the bondpads and passivation layer on the die. The design criteria of such contacts is somewhat different from the design criteria of the carrier package.

SUMMARY OF THE INVENTION

It has been found desirable to perform testing and related procedures in discrete fixtures prior to final assembly. In order to accomplish this, a reusable burn-in/test fixture for discrete die is provided. The fixture preferably consists of two halves, one of which is a die cavity plate for receiving a semiconductor die as the units under test (UUT).

An intermediate substrate is used to establish ohmic contact with the die at bondpads or testpoints. The intermediate substrate is connected to conductors on the reusable test fixture, so that the bondpads or testpoints are in electrical communication with the conductors on the test fixture.

The intermediate substrate is preferably formed of a semiconductor material, and includes circuitry which is used to conduct signals between bondpad locations and external connector leads on the fixture. The substrate with circuitry is able to establish contact with the external connector leads, or with other leads on the fixture which are in communication with the external connector leads. In the preferred embodiment, the substrate is formed from silicon, although other semiconductor materials may be used. Examples of alternative materials include germanium and silicon on saphire (SOS).

The substrate is formed with portions having increased height, such as bumps. These bumps, in turn, are formed with raised portions or points, so that the raised portion may penetrate the bondpad, while the remainder of the bump functions to limit penetration depth of the raised portion. This permits the penetration depth of the bump to be controlled by the physical dimensions of the raised portion. This results in the bumps being self-limiting in their penetration of the bondpads.

In a modification of the invention, a Z-axis anisotropic conductive interconnect material is provided as an interface between the substrate and the die. The Z-axis anisotropic conductive interconnect material is used to establish ohmic contact with bondpads or the equivalent attach points on the semiconductor die. The Z-axis anisotropic conductive interconnect material is able to conform to the shape of the die at the bondpad sufficiently to establish the ohmic contact without substantially damaging the bondpad. Since contact is able to be established by biasing force, it is possible to perform burn in and test of the die without resorting to bonding a conductor to the bondpad.

The Z-axis anisotropic conductive interconnect material is a metal filled polymer composite which is able to function as a compliant interconnection material for connector and testing applications. This material is in a group of materials which are referred to as elastomeric conductive polymer interconnect (ECPI) materials. These are available from AT&T Bell Laboratories, of Allentown, Pa., or Shin Etsu Polymer America Inc., of Union City, Calif., 3M Company of Minneapolis, Minn., at their Austin, Tex. plant or Nitto Denko America, Inc., San Jose, Calif. (a subsidiary of Nitto Denko Corporation of Japan).

The contact between the bondpads and the external connector leads is therefore established by utilizing the Z-axis anisotropic conductive interconnect material and substrate with circuitry. Conductors on the Z-axis anisotropic conductive interconnect material and substrate with circuitry extend from the bondpads to connection points, and the connection points conduct to contacts, which are in turn in communication with the external connector leads. The self-limiting nature of the bump is transferred through the Z-axis anisotropic conductive interconnect material so that the potential damage to the bondpad by force exerted through the Z-axis anisotropic conductive interconnect material is limited.

In a preferred embodiment, the intermediate substrate is placed in the die receiving cavity and is electrically connected to conductors on the fixture, which in turn are connected to the connector pins. The die is placed face down in the die receiving cavity. The substrate is attached to conductors on the fixture, which in turn are connected to the connector pins. Ohmic contact is established between bondpads or testpoints on the die and conductors on the substrate.

Z-axis anisotropic conductive interconnect material may be placed in the die receiving cavity beneath the die so that the ohmic contact with the bondpads or testpoints on the die may be established through the Z-axis anisotropic conductive interconnect material, through the substrate, to communicate with external connector leads on the fixture.

In an alternate embodiment, a die is placed face up in a cavity in a first half of the fixture, and the semiconductor substrate is placed over the die. In the preferred form of that embodiment, the external connector leads are connector pins, which preferably are in a DIP (dual inline package) or QFP (quad flat pack) configuration. The pins terminate at the connection points.

The fixture establishes electrical contact with the a single die and with a burn-in oven, as well as permitting testing of dies in discretely packaged form.

If the die is placed face up in a cavity in a first half of the fixture, the substrate may be placed between the die and a lid. Attachment of the die to the external connection leads is established either through contact points on the substrate, or through the contact points through the Z-axis anisotropic conductive interconnect material, in which case, the substrate establishes contact with the Z-axis anisotropic conductive interconnect material.

DETAILED DESCRIPTION OF THE PREFERRED EMBODIMENT

Figure 1:
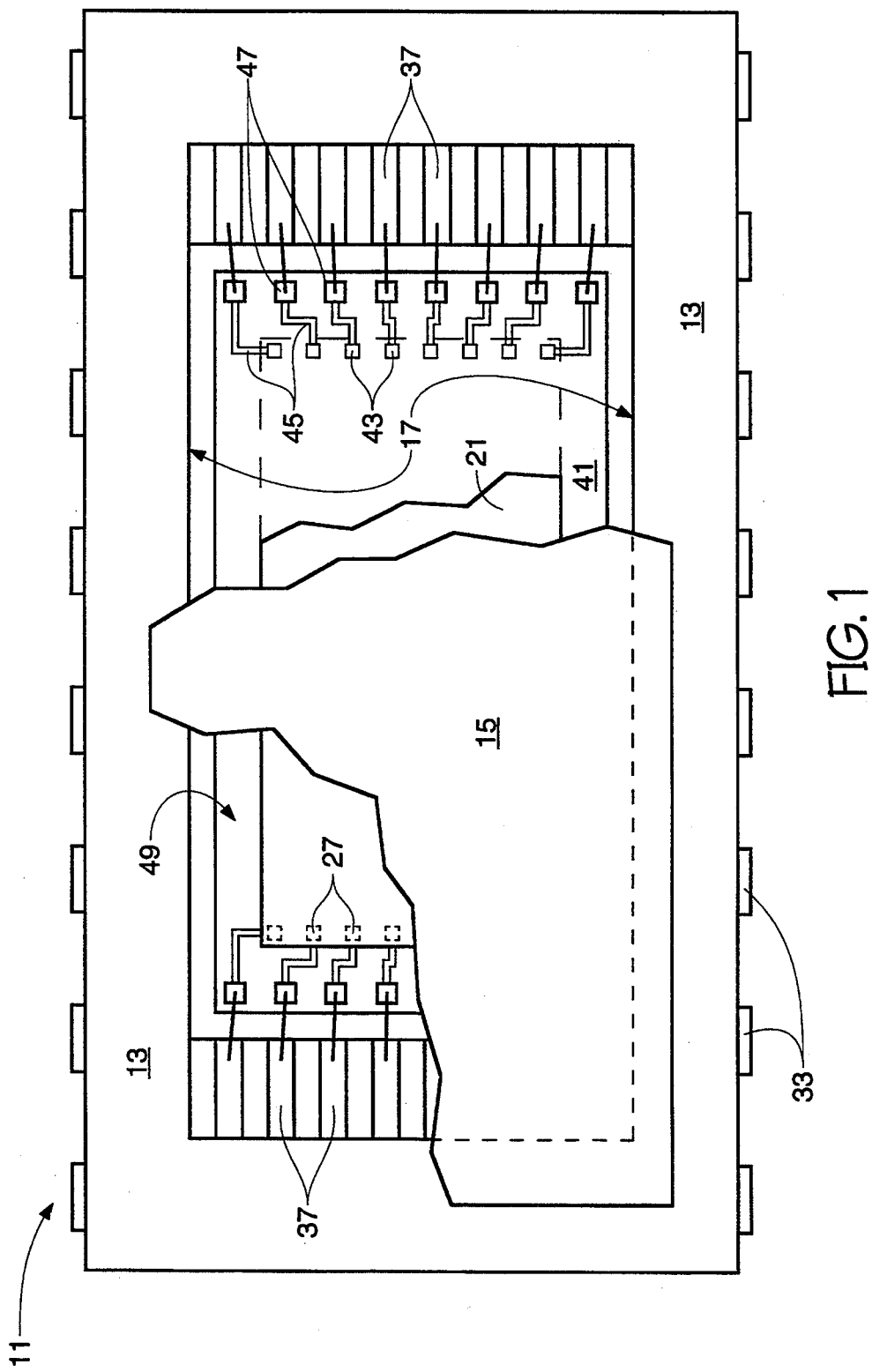
FIGS. 1 and 2 show a preferred embodiment of the inventive burn-in fixture.
Figure 2:
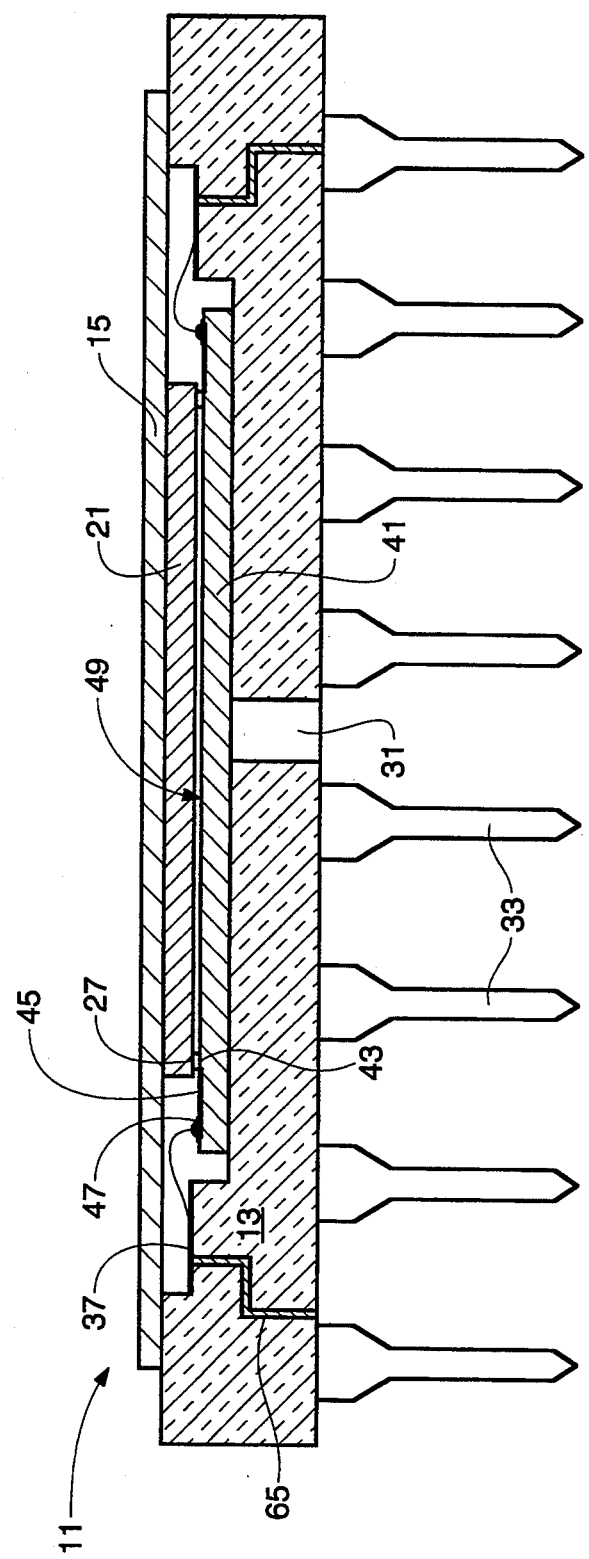

Referring to FIGS. 1 and 2, the inventive burn-in fixture 11 includes a die cavity plate, 13 and a cover 15. The die cavity plate 13 includes a die receiving cavity 17.

The die receiving cavity 17 has dimensions which are at least sufficient to accommodate a die 21. The die 21 is to be connected at bondpads 27, which are typically 0.1 mm wide. The die cavity plate 13 has a slot 31 which permits convenient access to the bottom of the die 21 in order that the die 21 may be lifted out of the die receiving cavity 17. Alignment of the die 21 in the die cavity plate 13 is achieved by aligning the cover 15 and die 21 to the bondpad 27.

A plurality of external connector leads 33 extend from the burn in fixture 11. As can be seen in FIG. 2, in the preferred embodiment, the external connector leads 33 are attached to the die cavity plate 13, and extend therefrom. The external connector leads 33 are shown as connector pins, which preferably are in a DIP (dual inline package) or QFP (quad flat pack) configuration.

The external connector leads 33 are secured by the die cavity plate 13 and terminate on the die cavity plate 13 with contact pads 37.

Figure 3:
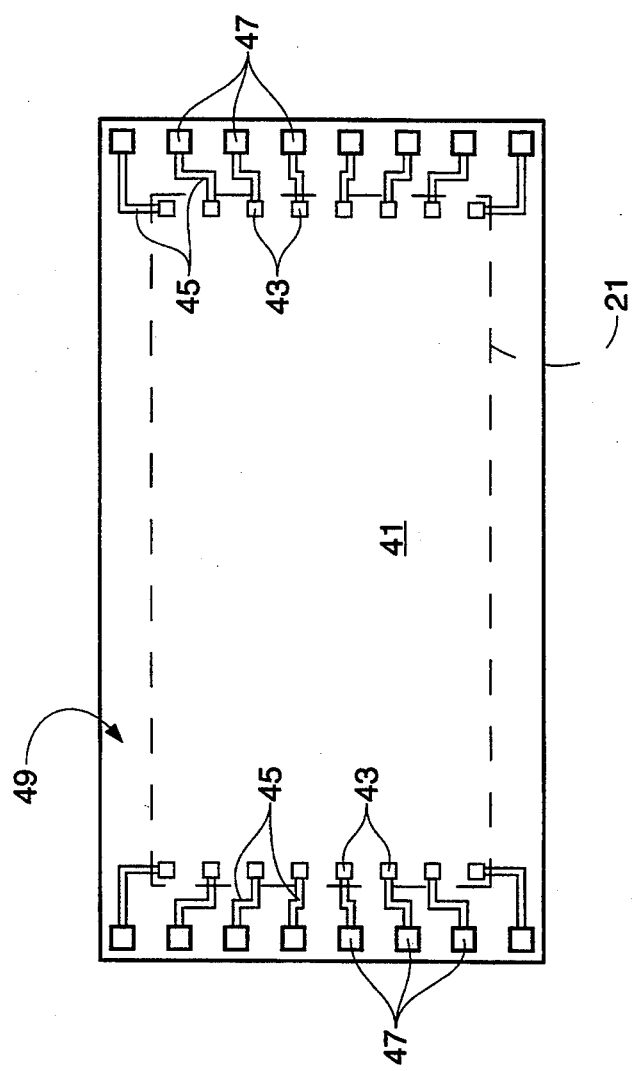
FIG. 3 shows details of an intermediate substrate formed of silicon according to the invention.

Referring to FIG. 3, as well as FIGS. 1 and 2, an intermediate substrate 41 is used to extend between a wire connection to the contact pads 37 on the die cavity plate 13 and the bondpads 27. The intermediate substrate 41 includes a plurality of die contacts 43 which establish ohmic contact with the bondpads 27 or other test points on the die 21.

The intermediate substrate 41 is preferably formed of silicon, and includes a plurality of conductive circuit traces 45 thereon which communicate with substrate bondpads 47. The conductive traces 45 are preferably on a top surface 49 of the intermediate substrate 41. The substrate bondpads 47 are connected to the contact pads 37 by any convenient means, such as by wirebond. The use of silicon or other semiconductor material for forming the intermediate substrate 41 permits the contacts 43 and conductive traces 45 to be formed on the substrate by semiconductor circuit fabrication techniques, such as those used to form conductive lines and bondpads on semiconductors integrated circuit devices.

The intermediate substrate 41 may be formed as a rigid, semirigid, semiflexible or flexible material. In the case of silicon, as the substrate material, it is possible to form the material thin enough that it is at least semiflexible. In the preferred embodiment, a rigid substrate is used.

In the preferred embodiment, the intermediate substrate 41 is substantially rigid. The rigidity is sufficient that, when the intermediate substrate 41 is aligned with the die 21, the height of the die contacts 43 nearly align in a Z axis direction with the bondpads 27 and that contact is established between the bondpads 27 and die contacts 43 without the need to significantly distort the intermediate substrate 41. Typically such contact is achieved at all desired points by allowing the die contacts 43 to be depressed, or by the use of a Z-axis anisotropic conductive interconnect material (67, FIG. 7).

The intermediate substrate 41 may also be formed of other semiconductor process materials such as silicon on saphire (SOS), silicon on glass (SOG) or semiconductor process materials using semiconductor materials other than silicon.

Figure 4:
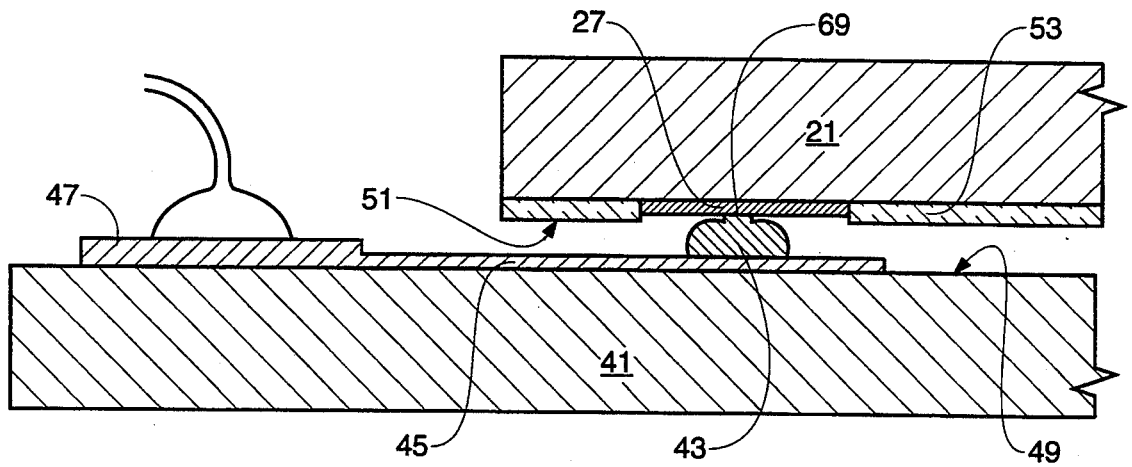
FIG. 4 shows details of electrical ohmic contact of the substrate with bondpads on a die.

The bondpads, as can be seen in FIG. 4, are typically recessed below a top surface level 51, established by a BPSG passivation layer 53.

Figure 5:
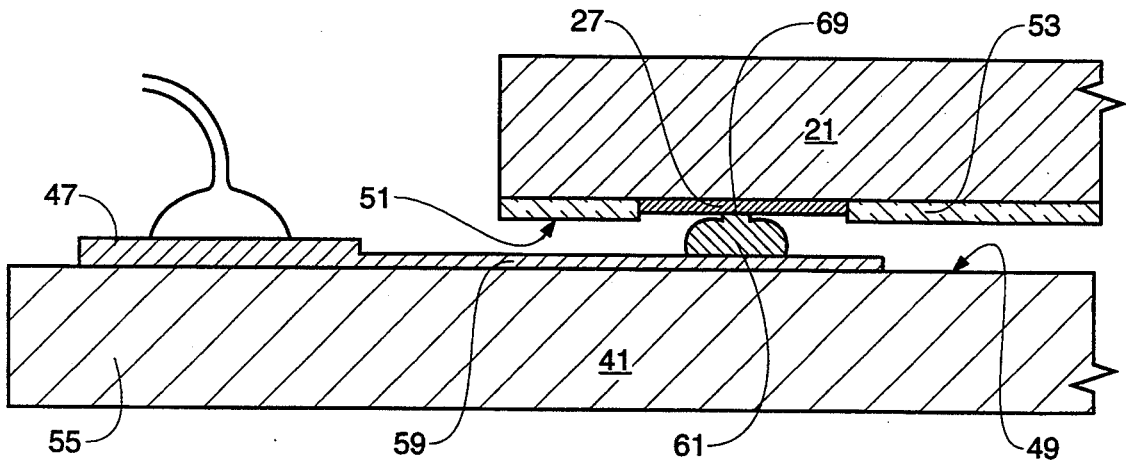
FIG. 5 shows details of an intermediate substrate formed from a ceramic material with conductive traces.

Alternatively, as shown in FIG. 5, the intermediate substrate 41 may be formed from a ceramic material 55 onto which are formed a plurality of conductive traces 59. The conductive traces 59 have bumps 61 which are intended for registration with a bondpad 27, or a contact pad should the substrate 41 extend that far. The conductive traces 59 therefore are able to conduct signals between the bondpads 27 and the contact pads 37, provided that ohmic contact is established between the bondpads 27 and contact pads 37 and the respective bumps 61. It is also possible to use any other suitable interconnect, including for example flexible, rigid or semi-rigid polyimide tape.

In either the silicon or the ceramic substrate, the conductive traces and the die contacts 43 (FIG. 3) or the bumps 61 (FIG. 5), may be made of metal conductors or of any material which has significant conductivity, provided that the conductivity of the element is sufficient to permit electrical testing of the die.

The use of an intermediate substrate 41 allows dies with different patterns of bondpads 27 to be aligned with a version of the intermediate circuit trace substrate 41 custom made for that die, with several variants of the intermediate circuit trace substrate 41 mating with the same die cavity plate 13.

Since the intermediate substrate 41 also has the die contacts 43 thereon, the lifetime of the die contacts 43 is not directly determinative of the lifetime of the die cavity plate 13. Also, in the preferred embodiment, the external connector leads 33 are electrically connected to the contact pads 37 by internal conductors 65. The fact that the conductive traces 45 are on the top surface 49 of the intermediate substrate 41 facilitate the formation of elevated contacts on the die contacts 43, and allow the use of materials which are suitable for the formation of the elevated contacts.

The die 21 is placed on the intermediate substrate 41 with bondpads 27 on the die 21 aligned with the die contacts 43. Raised asperities 69 are located at the point of contact of the die contacts 43 with the bondpads 27. The raised asperities 69 are formed on the die contacts 43. In the case of a ceramic intermediate substrate, the asperities are formed by a combination of photoplating techniques and doinking. Other techniques for depositing material may be used in lieu of photoplating, such as stenciling, screen printing or direct writing. The doinking process is described in copending U.S. patent application Ser. No. 7/898,617, filed Jun. 15, 1992, for PROCESS FOR FORMING RAISED SURFACE IRREGULARITIES BY ULTRASONIC FORGING, by Alan Wood, David Hembree and Warren Farnworth, and U.S. Pat. No. 5,249,450, (Ser. No. 7/898,625), for PROBEHEAD FOR ULTRASONIC FORGING, by Alan Wood, David Hembree, Larry Cromar and Warren Farnworth. It is anticipated that the intermediate substrate 41 may be repeatedly used, and the die contacts 43 re-doinked between uses.

Figure 6:
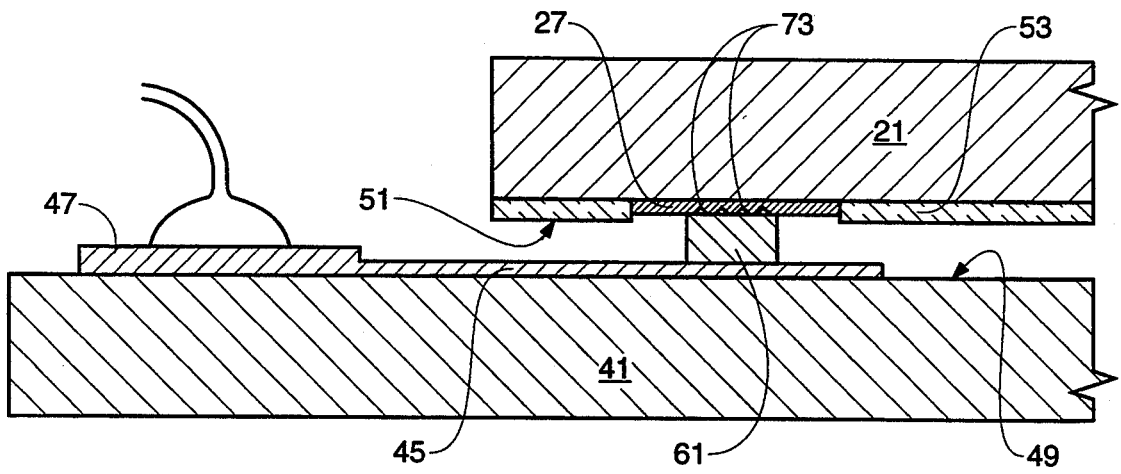
FIG. 6 shows details of a raised portion of a bump, wherein the bump may be self-limiting in its penetration of the bondpads.

As shown on FIG. 6, the bumps 61 on the intermediate substrate 41 may be formed with raised portions 73. The raised portion 73 may penetrate the bondpad 27 or contact pad 37, while the remainder of the bump 61 functions to limit penetration depth of the raised portion 73. This permits the penetration depth of the bump 61 to be controlled by the physical dimensions of the raised portion 73. This results in the bumps 61 being self-limiting in their penetration of the bondpads 27, since the force required to cause the raised portion 73 to penetrate the bondpad 27 is significantly less than the force required for the remainder of the bump 61 to penetrate the bondpad 27.

Figure 7:
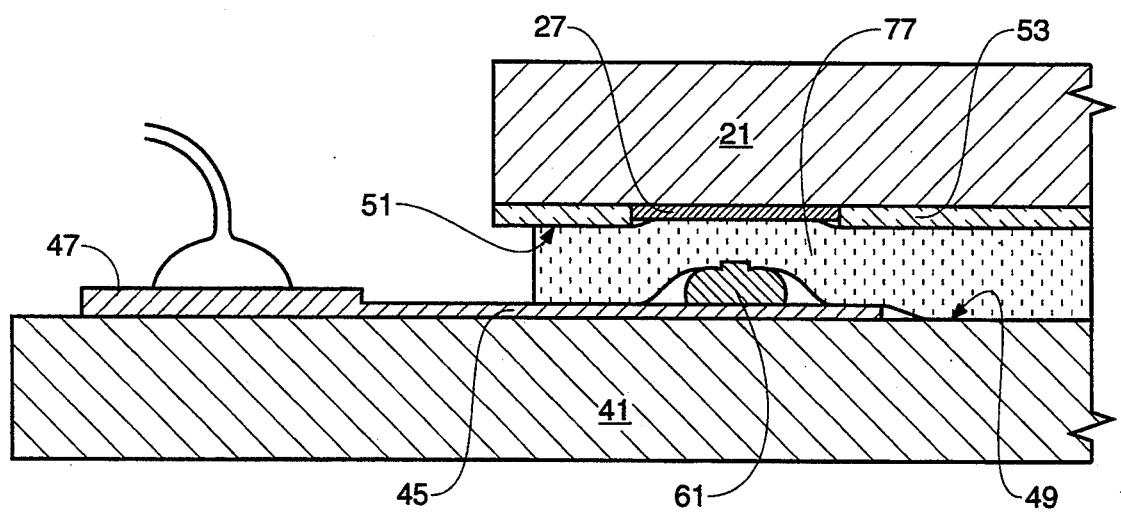
FIG. 7 shows details of Z-axis anisotropic conductive interconnect material and an intermediate substrate used with one embodiment of the invention.

FIG. 7 shows the use of a Z-axis anisotropic conductive interconnect material 77. The Z-axis anisotropic conductive interconnect material 77 functions as an interface between the intermediate substrate 41 and the bondpads or testpoints 27.

The Z-axis anisotropic conductive interconnect material 77 is particularly useful in cases in which the bondpads 27 are recessed below a BPSG passivation layer on the die 21. Other advantages of the Z-axis anisotropic conductive interconnect material 77 result from it being easily replaced when sequentially testing different dies 21 in the same package. The Z-axis anisotropic conductive interconnect material 77 is able to elastically deform in establishing ohmic contact with the bondpads 27, so that replacement or redoinking of the intermediate substrate 41 may be required less often.

As can be seen in FIG. 7, the bondpads 27 are in some cases recessed beneath the top surface of the die, as a result of the application of the passivation layer 53. The bondpads 27 also tend to be fragile. If the Z-axis anisotropic conductive interconnect material 77 is used to provide an interface between the bondpad 27 and the intermediate substrate 41, ohmic contact to be made through the Z-axis anisotropic conductive interconnect material 77, rather than directly between the intermediate substrate 41 and the bondpads 27. Conveniently, the Z-axis anisotropic conductive interconnect material is also able to extend between the intermediate substrate 41 and the contact pads 37, thereby also facilitating the connection of the intermediate substrate 41 to the contact pads 37.

The use of the Z-axis anisotropic conductive interconnect material 77 between the bondpads 27 and the intermediate substrate 41 performs several functions. The ability of the Z-axis anisotropic conductive interconnect material to resiliently deform permits it to distort sufficiently to reach into the recesses defined by the bondpads 27. The compliant nature of the Z-axis anisotropic conductive interconnect material 77 permits ohmic contact to be made with the bondpads 27 with a minimum of damage to the bondpads. This is important in the burn in and testing of unpackaged die because it is desired that the bondpads remain substantially undamaged subsequent to burn in and testing. The compliant nature of the Z-axis anisotropic conductive interconnect material 77 permits an intermediate contact member such as the intermediate substrate 41 to be slightly misaligned with the bondpads 27. As long as there is a sufficient amount of material in the conductive path beneath the intermediate substrate 41 which is also in contact with the bondpads 27, ohmic contact will be established. It is also necessary to provide a biasing force to maintain ohmic contact. While the biasing force may be achieved by using a further elastomeric pad (79, shown in FIG. 9), the elastomeric nature of the Z-axis anisotropic conductive interconnect material 77 is also able to provide some biasing force.

Significantly, the Z-axis anisotropic conductive interconnect material 77 need not be permanently bonded to the bondpads 27. Ohmic contact is established by biasing force. This enables the Z-axis anisotropic conductive interconnect material 77 and intermediate substrate 41 to be lifted from the die 21 without destroying the bondpads 27.

The Z-axis anisotropic conductive interconnect material 77 and intermediate substrate 41 therefore are able to conduct signals between the bondpads 27 and the die contacts 43.

It is also possible to permanently bond the Z-axis anisotropic conductive interconnect material 77 and the intermediate substrate 41 to the die 21, and to retain the attachment to the intermediate substrate 41 to the die 21 subsequent to burn in.

Figure 8:
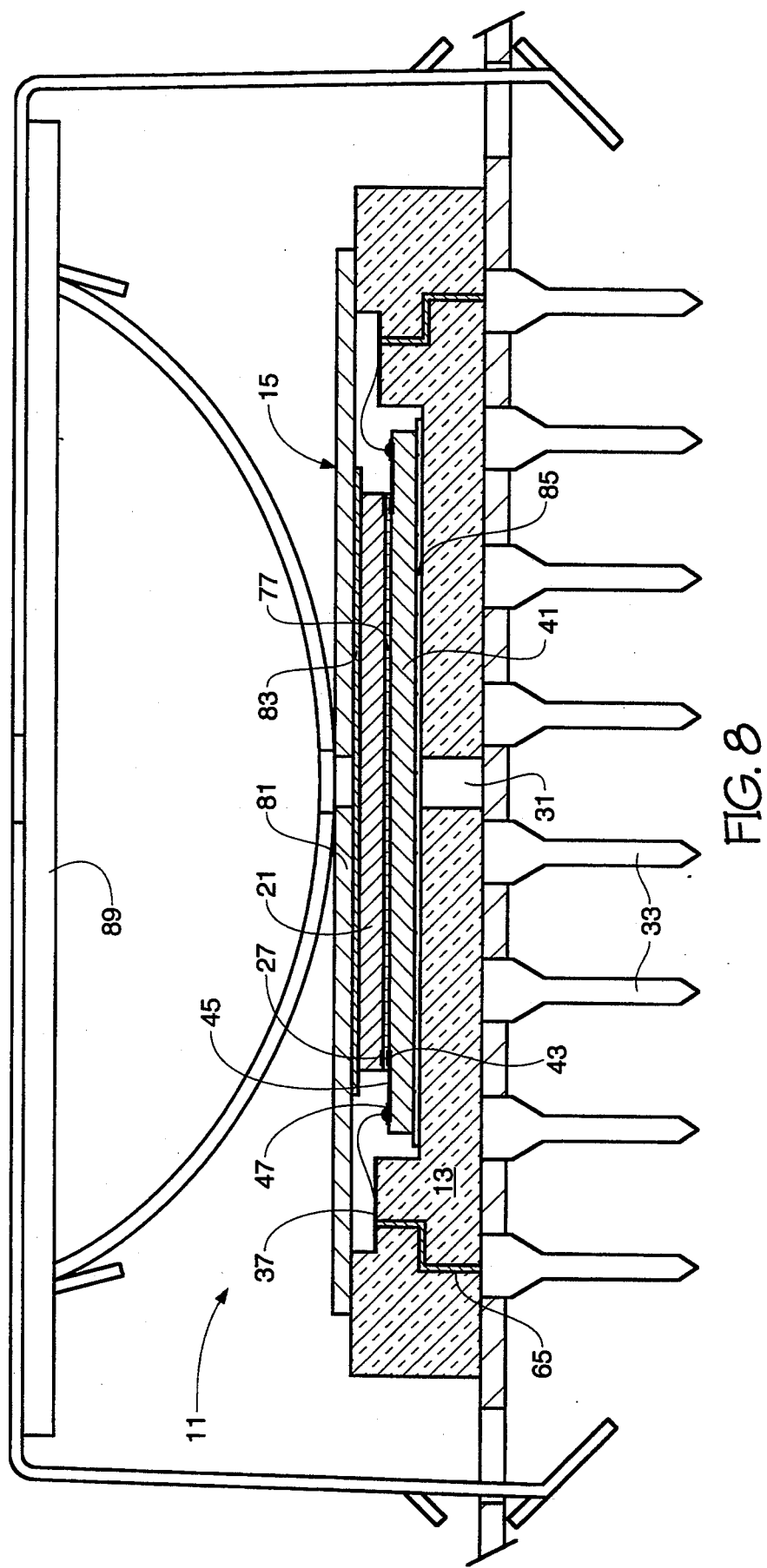
FIG. 8 shows a modification to the embodiment of FIGS. 1 and 2, in which a resilient strip is used to bias the die against the intermediate substrate.

The cover 15 includes a rigid cover plate 81 and an optional resilient compressible elastomeric strip 83, which serves as a resilient biasing member, as shown in FIG. 8. When the cover plate 81 is secured to the die cavity plate 13, the elastomeric strip 83 biases the Z-axis anisotropic conductive interconnect material 77 and intermediate substrate 41 against the die 21. This establishes an ohmic contact between the bondpads 27 and the conductive traces on the intermediate substrate 41, without the intermediate substrate 41 being bonded to the bondpads 27.

It has been found that an optimum technique for temporarily securing the intermediate substrate 41 in place in the die cavity plate 13 is the use of a precured RTV silicone strip, commonly known as "gel pack," as a backing strip 85. The backing strip 85 exhibits a static charge sufficient and coefficient of friction sufficient to hold the intermediate substrate 41 in place without adhesive, and also is elastomeric. In other words, the silicone holds the silicon in place and biases the silicon against the intermediate substrate 41 and cover plate 81.

The elastomeric strip 83 is considered optional because it has been found that an optimum technique for temporarily securing the intermediate substrate 41 in place in the die cavity plate 13 is the use of the precured RTV silicone strip as a backing strip 85. With the use of the backing strip 85, the die 21 therefore is biased against the intermediate substrate 41 even without the use of the elastomeric strip 83, provided that the distances are appropriately selected to effect biasing.

The non-bonded contact of the Z-axis anisotropic conductive interconnect material 77 is significant at the bondpads 27. Contact between the intermediate substrate 41 and the contact pads 37 on the fixture 11 may be effected by bonding techniques. Such bonding is not expected to deteriorate the fixture 11, even though the fixture is used multiple times. If bonding is used for such contact, then the conductive material from the intermediate substrate may remain with the fixture 11, but without detriment to the operation of the fixture 11.

"Flip chip" optical alignment is used to align the cover plate 81 with the die cavity plate 13. A clamp 89 then secures the cover plate 81 in place over the die cavity plate 13. The clamp 89 may consist of a wire clasp which may either be latched into place against itself, as shown, or is fitted into parallel horizontal locations in the die cavity plate 13 and the cover plate 81. With the cover plate 81 in place, conductors on the intermediate substrate 41 extend from the bondpads 27 to the location of contact pads 37, so that the bondpads 27 are in electrical communication with the external connector leads 33.

In the preferred embodiment, the clamp 89 is part of an external clamping system as described in U.S. patent Ser. No. 8/46,675, filed May 14, 1993, entitled "CLAMPED CARRIER FOR TESTING OF SEMICONDUCTOR DIES". This patent application is hereby incorporated by reference.

Providing the intermediate substrate 41 allows the die 21 is placed face down, so as to establish connection between the bondpads 27 and die contacts 43. The Z-axis anisotropic conductive interconnect material 77 in this case is beneath the die 21. A precured RTV silicone backing strip 83 is used to secure the die 21 to the cover plate 81 and to bias the die 21 against the die contacts 43.

Figure 9:
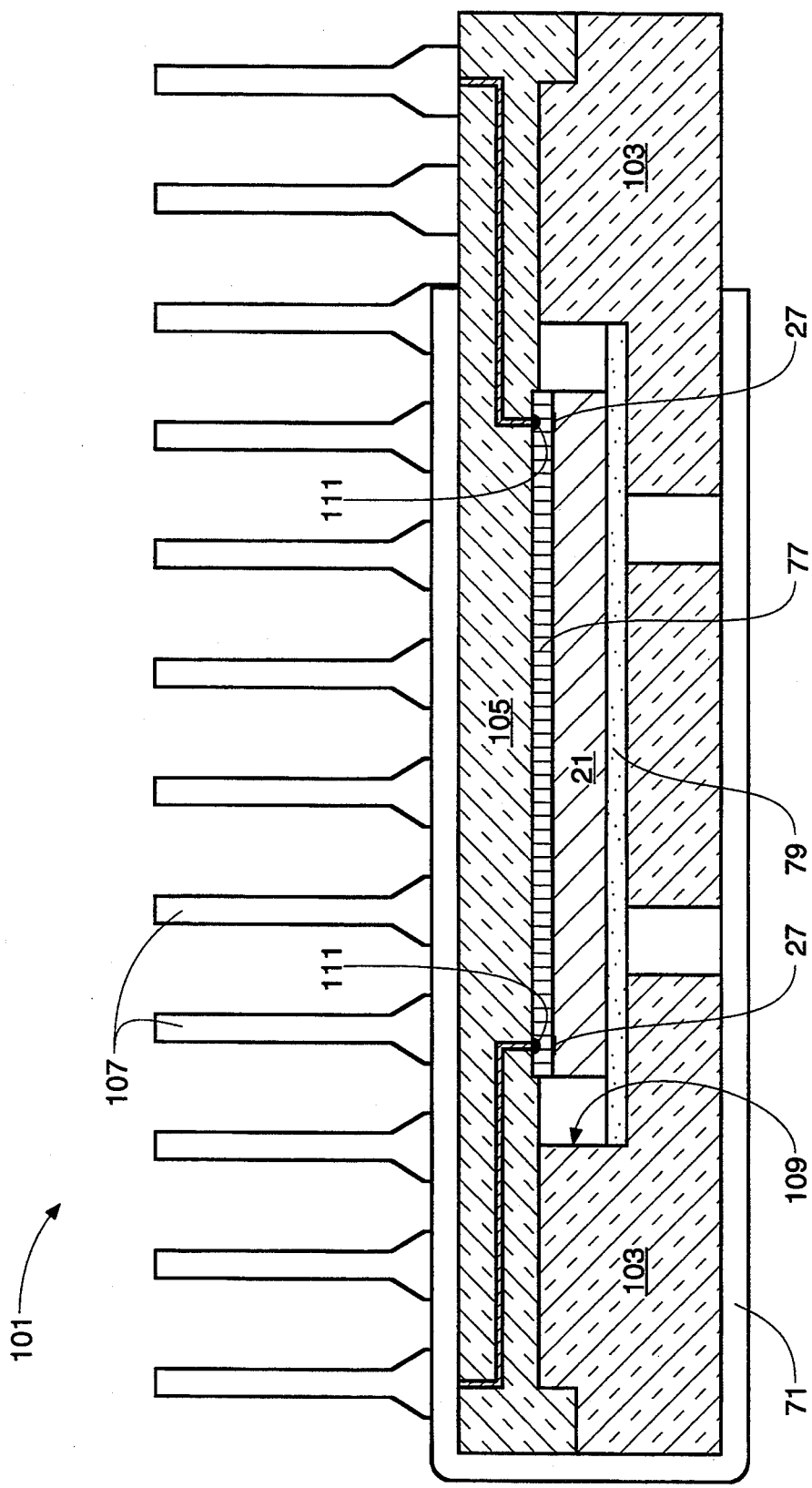
FIG. 9 shows a configuration of the invention in which a die receiving housing is used to retain a die face up.

In an alternate embodiment of a package 101, shown in FIG. 9, a die receiving housing 103 having backing strip 79 is used to retain a die 21 face up and an intermediate substrate 105 is placed above the die 21. The intermediate substrate 105 connects the die 21 to external test circuitry through connections on the die cavity housing. The die receiving housing 103 contains a die receiving cavity 109, which supports the die 21 in alignment with electrical contacts 111 which align with bondpads 27 on the die 21.

If Z-axis anisotropic conductive interconnect material 77 is used, the Z-axis anisotropic conductive interconnect material 77 is positioned between the die 21 and the upper portion 105, so that the electrical connection is established between the bondpads 27 and the contacts 111, and hence with the connector pins 107.

Figure 10:
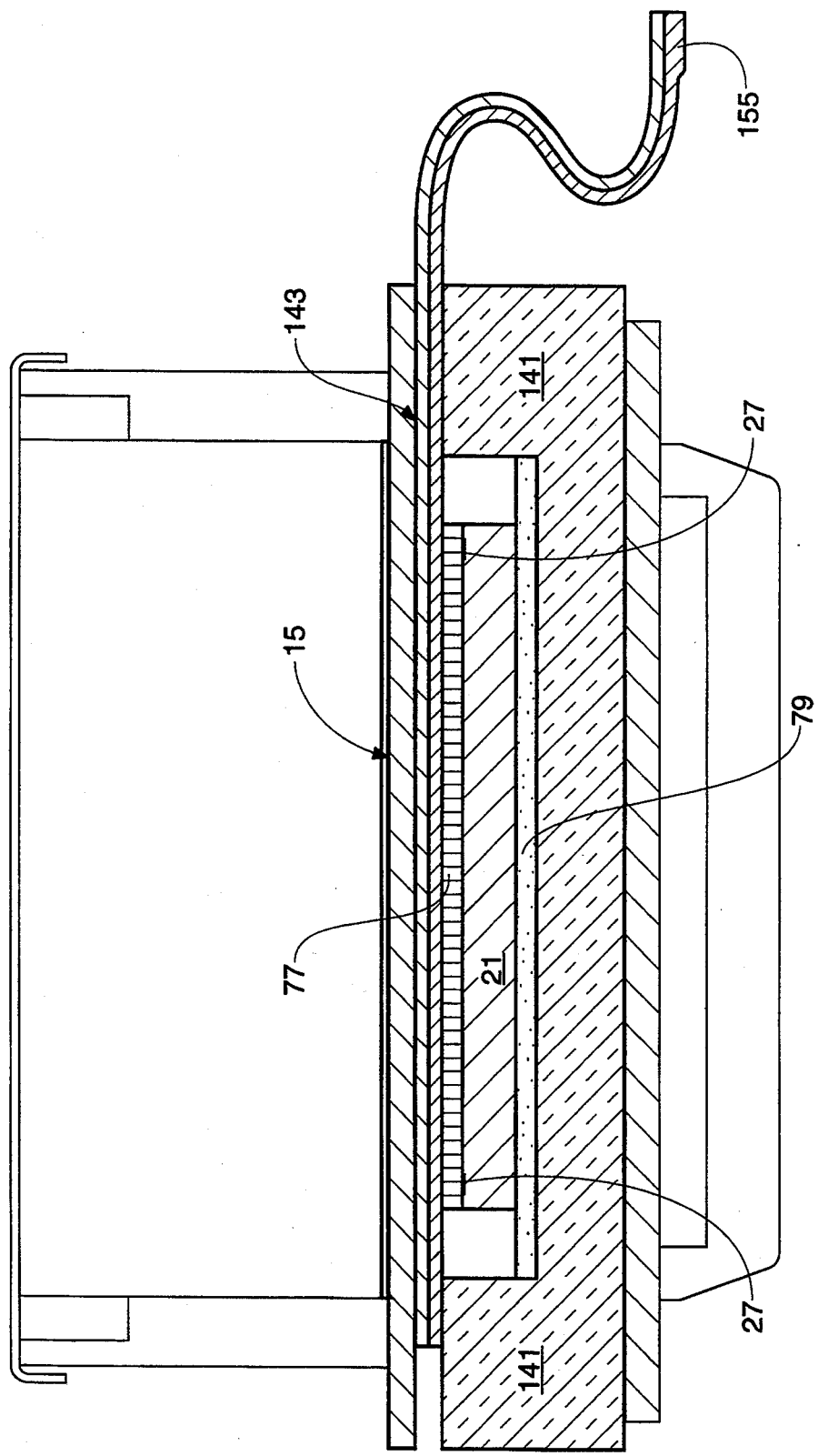
FIG. 10 shows a modification of the invention, in which an intermediate substrate is used to directly connect the die to an external connector connected to external test circuitry.

FIG. 10 shows a configuration in which a housing fixture 141 having backing strip 79 merely retains the die 21 in electrical communication with an intermediate substrate 143. The intermediate substrate 143 extends beyond the confines of the fixture 141 and terminates in an external connector 155. The Z-axis anisotropic conductive interconnect material 77, if used, is positioned between the intermediate substrate 143 and the die 21, so as to establish contact with the diepads 27.

Figure 11:
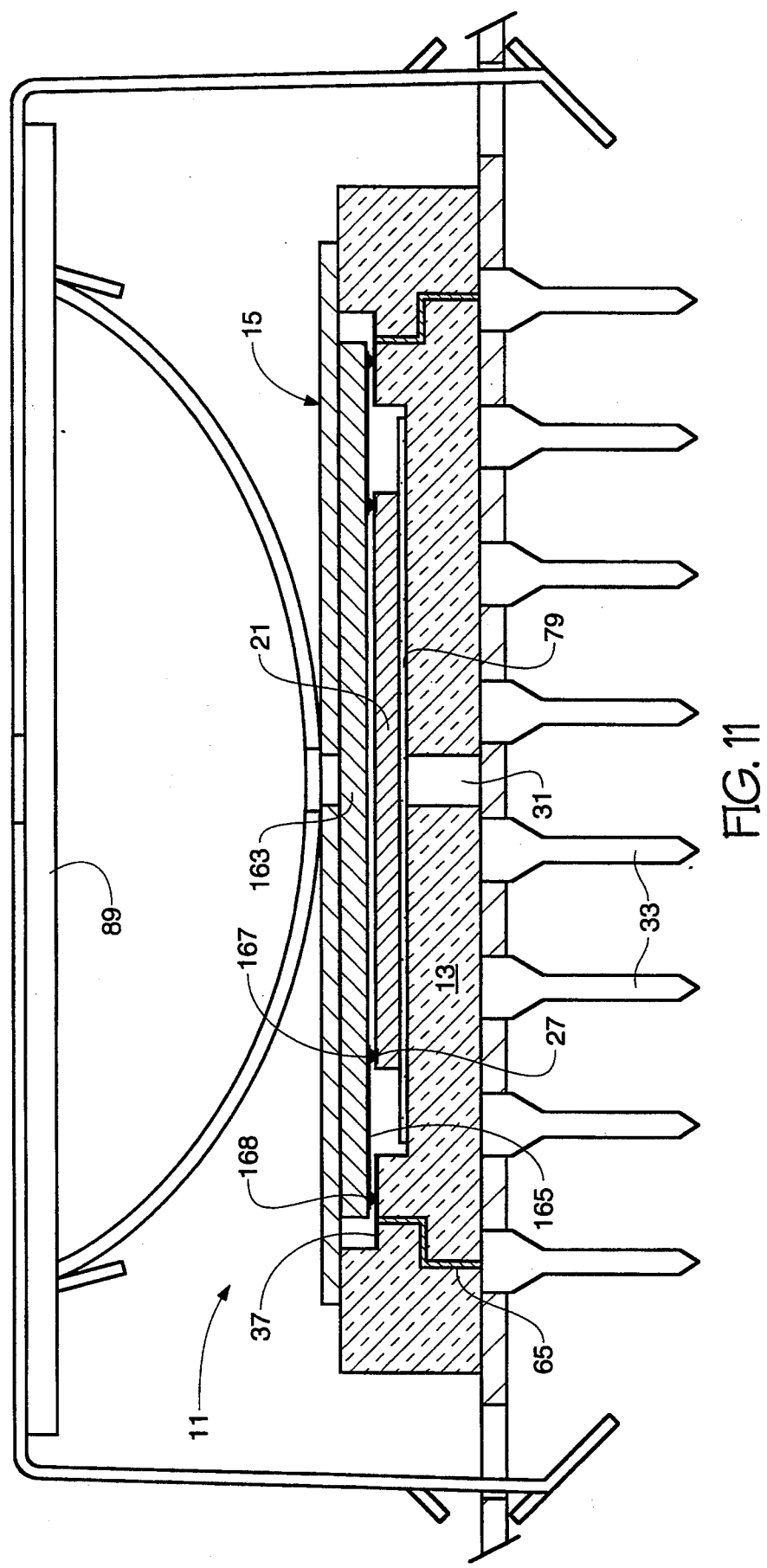
FIG. 11 shows a configuration in which an intermediate substrate extends over the die and a part of the die cavity plate which includes electrical contacts.

FIG. 11 shows a configuration in which an intermediate substrate 163 having conductors 165 is placed over a die 21 retained by backing strip 79. The die 21 is placed face up and bumps 167 on the substrate 163 face down to engage the bondpads 27. Advantageously, the substrate 163 may extend over the contact pads 37 on the die cavity plate 13. A second set of bumps 168 on the substrate 163 establish ohmic contact with the contact pads, which electrically connects the conductors 165 on the substrate 163 to the contact pads 37.

While specific locations for bondpads had not been specified, it is possible to test a variety of configurations, including the conventional arrangement of bondpads at the ends of the die 21. The invention may also be used for testing die configured for LOC (leads over chip), as well as other designs. In each of the above examples, the assembled fixture is adapted for testing with conventional test equipment, such as a burn-in oven. What has been described is a very specific configuration of a test fixture. Clearly, modification to the existing apparatus can be made within the scope of the invention. While the configuration of a standard DIP package has been shown in the drawings, it is anticipated that other package configurations may be used. Other common configurations include PGA (pin grid array), LCC (leadless chip carrier) and MCR (molded carrier ring) packages, as well as other package types. It is also likely that specialized package types will be used, in which the configuration relates to convenient burnin and test handling. Accordingly, the invention should be read only as limited by the claims.

What is claimed is:

1. A discrete testing apparatus for testing a semiconductor integrated circuit device in die form, comprising:
   a) a first plate;
   b) a die-receiving cavity in the first plate;
   c) a second plate associated with the first plate;
   d) one of the first and second plates having a plurality of connector leads thereon;
   e) an intermediate substrate located within the die receiving cavity, the intermediate substrate having a plurality of die contacting conductors extending therefrom, the die contacting conductors extending to die contacts to establish electrical communication with contact locations on the die;
   f) the die contacts being positioned so that, when the die is positioned in the die-receiving cavity, the die contacts are in alignment with contact locations on the die and extending to the contact locations to establish electrical communication with said contact locations; and
   g) the connector leads in electrical communication with the die contacts, the connector leads being mounted to the one of the said plates.

2. A discrete testing apparatus as described in claim 1, and wherein;
   the intermediate substrate is formed of semiconductor material, and the die contacting conductors are formed on the semiconductor material by semiconductor circuit fabrication techniques.

3. A discrete testing apparatus as described in claim 2, and wherein;
   the intermediate substrate is of a thickness sufficient to be substantially rigid.

4. A discrete testing apparatus as described in claim 2, and wherein:
   the intermediate substrate is sufficiently thin to be partially flexible.

5. A discrete testing apparatus as described in claim 1, and wherein:
   the intermediate substrate is formed of a structure which includes silicon material, and the die contacting conductors are formed on the silicon material by semiconductor fabrication techniques.

6. A discrete testing apparatus as described in claim 5, and wherein;
   the intermediate substrate is formed with a thickness sufficient to be substantially rigid.

7. A discrete testing apparatus as described in claim 5, and wherein:
   the intermediate substrate is sufficiently thin to be partially flexible.

8. A discrete testing apparatus as described in claim 1 and wherein:
   a) the intermediate substrate is formed of a ceramic insulator, and the die contacting conductors are formed on a surface of the substrate; and
   b) the intermediate substrate having a plurality of circuit traces formed thereon extending from the die contacting conductors to connection points in electrical communication with substrate bond pads wire bonded to contact pads on said one of the first and second plates having a plurality of connector leads thereon.

9. A discrete testing apparatus as described in claim 1 and wherein:
   the intermediate substrate is positioned in the die receiving cavity so that the die contacts on the intermediate substrate face away from the first plate, wherein the die is positioned above the intermediate substrate with the contact locations on the die facing the die receiving cavity.

10. A discrete testing apparatus as described in claim 1, and wherein:
    the intermediate substrate is positioned in the die receiving cavity so that the die contacts on the intermediate substrate are in a face up position with respect to the die receiving cavity and the die is positioned above the intermediate substrate with the contact locations in a face down position on the die facing the die receiving cavity.

11. A discrete testing apparatus as described in claim 1, and wherein:
    the die is positioned in the die receiving cavity so that the contact locations on the die are in a face up position with respect to the die contacts on the intermediate substrate and the intermediate substrate is positioned above the die with the die contacts in a face down position on the intermediate substrate.

12. A discrete testing apparatus as described in claim 1, further comprising:
    a pad which is electrically conductive in a Z-axis, normal to a plane of the pad, and which provides electrical isolation across the plane of the pad, the pad being positioned between the die and the die contacts on the intermediate substrate.

13. A discrete testing apparatus as described in claim 1, further comprising:
    a resilient pad to bias die received in the die receiving cavity with the intermediate substrate after the first and second plates have been mated, to apply sufficient pressure to maintain ohmic contact between said die contacts on the intermediate substrate and said contact locations on the die.

14. A discrete testing apparatus as described in claim 13, and wherein:
    the die contacts on the intermediate substrate are formed as raised contact members which are in alignment with the die receiving cavity after the first and second plates have been mated, said contact members cooperating with said pad to apply sufficient pressure between said pad and said contact locations on the die to establish ohmic contact between said pad and said contact locations on the die.

15. A discrete testing apparatus as described in claim 1, further comprising:
    the die receiving cavity having a biased platform therein, the biased platform exerting a biasing force against the die to establish an electrical connection between the contact locations on the die and the die contacts.

16. A discrete testing apparatus as described in claim 1, further comprising:
an elastomeric backing strip mounted within the die receiving cavity to secure the substrate in a position within the die receiving cavity by means of electrostatic attraction and frictional forces.

17. A discrete testing apparatus as described in claim 1, further comprising:
an elastomeric backing strip mounted within the die receiving cavity to secure the die in a position within the die receiving cavity by means of electrostatic attraction and frictional forces.

18. A discrete testing apparatus as described in claim 1, further comprising:
a clamp adapted to contact the second plate to bias the die towards the intermediate substrate.

19. A discrete testing apparatus for testing a semiconductor device in die form, comprising:
a) a first plate;
b) a die-receiving cavity in the first plate;
c) a second plate;
d) means to secure the first and second plates together;
e) an intermediate substrate having a plurality of conductors thereon and dimensioned to fit within the testing apparatus adjacent to the die when the die is in the die receiving cavity;
f) a pad which is electrically conductive in a Z-axis, normal to a plane of the pad, and which provides electrical isolation across the plane of the pad, the pad being positioned over the die between the die and the plurality of conductors; and
g) a plurality of die contacts formed on the plurality of conductors, the die contacts being positioned so that, when the first plate and the second plate are aligned and the die and the intermediate substrate are positioned in the die-receiving cavity, the die contacts are in alignment with contact locations on the die;
h) connector leads in an electrical communication with the plurality of die contacts; and
i) a support to hold the die, the pad, and the intermediate substrate together when the first plate and the second plate are secured together, thereby causing the die contacts to be maintained in electrical communication with said contact locations.

20. A discrete testing apparatus as described in claim 19, and wherein:
the intermediate substrate is formed as a structure which includes silicon material, and the die contacting conductors are formed on the silicon material by semiconductor fabrication techniques.

21. A discrete testing apparatus as described in claim 20, and wherein:
the intermediate substrate is of a thickness sufficient to be substantially rigid.

22. A discrete testing apparatus as described in claim 20, and wherein;
the intermediate substrate is sufficiently thin to be partially flexible.

23. A discrete testing apparatus as described in claim 19, and wherein:
a) the intermediate substrate is formed of a ceramic insulator, and the die contacting conductors are formed on a surface of the intermediate substrate; and b) the intermediate substrate includes a plurality of circuit traces formed thereon extending from the die contacting conductors to connection points in electrical communication with substrate bond pads wire bonded to contact pads on said one of the first and second plates having a plurality of connector leads thereon.

24. A discrete testing apparatus as described in claim 19, and wherein:
the intermediate substrate extending beyond the confines of a fixture formed by the first and second plates and terminating in an external connector, the external connector including said connector leads.

25. A discrete testing apparatus as described in claim 19, and wherein:
said pad is elastically resilient, thereby biasing against the die received in the die receiving cavity with the intermediate substrate after the first and second plates have been mated.

26. A discrete testing apparatus as described in claim 19, further comprising:
means, separate from said pad, to bias the die received in the die receiving cavity with the intermediate substrate after the first and second plates have been mated, the means to bias cooperating with said pad to apply sufficient pressure between said pad and said contact locations on the die to establish ohmic contact between said pad and said contact locations on the die.

27. A discrete testing apparatus as described in claim 19, further comprising:
the die receiving cavity having a biased platform therein, the biased platform exerting a biasing force against the die, the biasing force cooperating with said pad in order to establish an electrical connection, through said pad, between the contact locations on the die and said plurality of die contacts.

28. A discrete testing apparatus as described in claim 27, and wherein:
the biased platform comprises an elastomeric polymer.

29. A discrete testing apparatus as described in claim 19, and wherein:
the intermediate substrate includes raised contact members which are in alignment with the die receiving cavity after the first and second plates have been mated, said contact members cooperating with said pad to apply sufficient pressure between said pad and said contact locations on the die to establish ohmic contact between said pad and said contact locations on the die.

30. A discrete testing apparatus as described in claim 21, further comprising:
a) an elastomeric strip, separate from said pad, cooperating with said pad to bias die received in the die receiving cavity with the intermediate substrate after the first and second plates have been mated, and to apply sufficient pressure between said pad and said contact locations on the die to establish ohmic contact between said pad and said contact locations on the die; and
b) the elastomeric strip further securing the die in a position within the die receiving cavity by means of electrostatic attraction and frictional forces, thereby permitting the die to be maintained in a positional alignment with respect to the die receiving cavity after being placed into the die receiving cavity and prior to mating the second plate with the first plate.

31. A discrete testing apparatus for testing a semiconductor integrated circuit device in die form, comprising:
    a) a first plate;
    b) means for holding a die in the testing apparatus;
    c) a second plate mating with the first plate;
    d) one of the first and second plates having a plurality of connector leads thereon;
    e) a substrate located between the first and second plates having a plurality of die contacting conductors extending therefrom, the die contacting conductors extending to die contacts to establish electrical communication with contact locations on the die, held within the testing apparatus;
    f) the die contacts being positioned so that, when the die is positioned between the first and second plates, the die contacts are in alignment with contact locations on the die;
    g) means for biasing the die and substrate together; and
    h) means for establishing electrical communication between the die contacts on the substrate and the connector leads on the one of the first and second plates.

32. A discrete testing apparatus as described in claim 31, and wherein:
    the means for establishing electrical communication is bond wires attached to the intermediate substrate and to the first plate.

33. A discrete testing apparatus as described in claim 31, and wherein:
    the means for biasing is a clamp attached to the first plate.

* * * * *